United States Patent
Jodka et al.

(10) Patent No.: US 10,673,337 B1
(45) Date of Patent: Jun. 2, 2020

(54) SWITCHED-MODE DC/DC CONVERTER HAVING A BOOTSTRAPPED HIGH-SIDE DRIVER

(71) Applicant: Texas Instruments Incorporated, Dallas, TX (US)

(72) Inventors: Eduardas Jodka, Freising (DE); Julian Becker, Freising (DE); Stefan Dietrich, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/265,027

(22) Filed: Feb. 1, 2019

Related U.S. Application Data

(60) Provisional application No. 62/785,845, filed on Dec. 28, 2018.

(51) Int. Cl.
| | |
|---|---|
| *H02M 3/158* | (2006.01) |
| *H02M 1/08* | (2006.01) |
| *H02M 1/088* | (2006.01) |
| *H02M 1/38* | (2007.01) |
| *H02M 3/156* | (2006.01) |
| *H02M 1/00* | (2006.01) |

(52) U.S. Cl.
CPC .......... *H02M 3/1582* (2013.01); *H02M 1/08* (2013.01); *H02M 1/088* (2013.01); *H02M 1/38* (2013.01); *H02M 3/156* (2013.01); *H02M 3/1588* (2013.01); *H02M 2001/007* (2013.01)

(58) Field of Classification Search
CPC ...... H02M 3/156–3/1588; H02M 1/38; H02M 1/088; H02M 1/096
See application file for complete search history.

(56) References Cited

U.S. PATENT DOCUMENTS

| | | | |
|---|---|---|---|
| 6,246,296 B1* | 6/2001 | Smith ................... | H02M 7/538 326/88 |
| 2008/0100378 A1* | 5/2008 | Bernacchia ......... | H02M 7/5388 327/589 |
| 2008/0224738 A1* | 9/2008 | Bodano ................ | H03K 5/1536 327/109 |
| 2008/0290911 A1* | 11/2008 | Williams ............... | H03K 17/18 327/109 |

(Continued)

*Primary Examiner* — Yusef A Ahmed
*Assistant Examiner* — Ishrat F Jamali
(74) *Attorney, Agent, or Firm* — Lawrence J. Bassuk; Charles A. Brill; Frank D. Cimino

(57) ABSTRACT

A switch-node rising edge detection circuit is provided for a switched-mode DC/DC boost converter. A high-side gate-driver couples a gate of the high-side NMOS power transistor to either a first terminal of a bootstrap capacitor or the switch-node. The detection circuit includes an AND gate that receives an activation signal on a first input and provides a switching signal to the high-side gate-driver. A PMOS transistor is coupled in series with an inverter between the first terminal of the bootstrap capacitor and a second input of the AND gate. The inverter receives supply voltages from the first terminal of the bootstrap capacitor and the switch-node. The gate of the PMOS transistor receives the activation signal. An NMOS transistor is coupled between an output voltage and a node between the PMOS transistor and the inverter. A gate of the NMOS transistor is coupled to the bootstrap capacitor's first terminal.

14 Claims, 9 Drawing Sheets

(56) References Cited

U.S. PATENT DOCUMENTS

| | | | | |
|---|---|---|---|---|
| 2012/0043950 | A1* | 2/2012 | Truong | H02M 3/158 |
| | | | | 323/282 |
| 2012/0319754 | A1* | 12/2012 | Lee | H02M 1/38 |
| | | | | 327/208 |
| 2013/0229207 | A1* | 9/2013 | Tseng | H03K 19/00361 |
| | | | | 327/109 |
| 2013/0264953 | A1* | 10/2013 | Cavallini | H05B 33/0815 |
| | | | | 315/186 |
| 2014/0183975 | A1* | 7/2014 | Wu | H02M 3/155 |
| | | | | 307/130 |
| 2015/0188425 | A1* | 7/2015 | Chang | H02M 3/158 |
| | | | | 323/271 |
| 2015/0256075 | A1* | 9/2015 | Lin | H02M 3/158 |
| | | | | 323/271 |
| 2016/0276933 | A1* | 9/2016 | Saito | H02M 3/158 |
| 2017/0155322 | A1* | 6/2017 | Zhang | H02M 1/36 |

* cited by examiner

SWITCHED-MODE DC/DC CONVERTER HAVING A BOOTSTRAPPED HIGH-SIDE DRIVER

PRIORITY UNDER 35 U.S.C. § 119(e) & 37 C.F.R. § 1.78

This non-provisional application claims priority based upon the following prior United States provisional patent application(s): (i) "Switched-Mode DC/DC Converter Having a Bootstrapped High-Side Driver," Application No. 62/785,845, filed Dec. 28, 2018, in the name(s) of Eduardas Jodka, Julian Becker, and Stefan Dietrich, which is hereby incorporated by reference in its entirety.

FIELD OF THE DISCLOSURE

Disclosed embodiments relate generally to the field of voltage conversion circuits. More particularly, and not by way of any limitation, the present disclosure is directed to a switched-mode DC/DC converter having a bootstrapped high-side driver.

BACKGROUND

In the power stage of a DC/DC boost converter two N-type metal oxide silicon (NMOS) transistors can be employed as low-side and high-side switches. This arrangement implies a bootstrapped gate-driver for the high-side switch and requires a non-overlap time between active phases of the low-side and high-side switches to avoid cross-conduction. The transition of the switch-node from a low state to a high state induces high frequency noise, which is often a concern with regard to electromagnetic interference (EMI). Further reduction of EMI is desirable.

SUMMARY

Disclosed embodiments provide a high-side gate-driver that includes a switch-node rising edge detection circuit that determines when the switch-node reaches a high state before allowing activation of the high-side NMOS transistor. This approach provides a greater ability to control the rising slope of the switch-node and prevents cross-conduction of the voltage converter power stage.

In one aspect, an embodiment of a switch-node rising edge detection circuit for a switched-mode DC/DC boost converter having a high-side gate-driver coupled to selectively couple one of a first terminal of a bootstrap capacitor and a switch-node to a gate of a high-side N-type metal oxide silicon (NMOS) power transistor is disclosed. The switch-node rising edge detection circuit includes an AND gate coupled to receive an activation signal on a first input and to provide a switching signal to the high-side gate-driver; a P-type metal oxide silicon (PMOS) transistor coupled in series with an inverter between the first terminal of the bootstrap capacitor and a second input of the AND gate, the inverter coupled to the first terminal of the bootstrap capacitor and to the switch-node to receive supply voltages and a gate of the PMOS transistor coupled to receive the activation signal; and an NMOS transistor coupled between an output voltage of the switched-mode DC/DC converter and a node that lies between the PMOS transistor and the inverter, a gate of the NMOS transistor being coupled to the first terminal of the bootstrap capacitor.

In another aspect, an embodiment of a switched-mode DC/DC boost converter is disclosed. The switched-mode DC/DC boost converter includes a high-side N-type metal oxide silicon (NMOS) power transistor coupled in series with a low-side NMOS power transistor between an output voltage and a lower supply voltage; a switch-node located between the high-side NMOS power transistor and the low-side NMOS power transistor; a bootstrap capacitor having a first terminal coupled to receive a bootstrap supply voltage and to provide a bootstrap voltage and a second terminal coupled to the switch-node; a high-side gate-driver coupled to selectively provide the bootstrap voltage to a gate of the high-side NMOS power transistor; an AND gate coupled to receive an activation signal on a first input and to provide a switching signal to the high-side gate-driver; a P-type metal oxide silicon (PMOS) transistor having a source coupled to the first terminal of the bootstrap capacitor and a gate coupled to receive the activation signal; an inverter coupled between a drain of the PMOS transistor and a second input of the AND gate, the inverter coupled to the first terminal of the bootstrap capacitor and to the switch-node to receive supply voltages; and an NMOS transistor coupled between the output voltage and the drain of the PMOS transistor, a gate of the NMOS transistor being coupled to a first terminal of the bootstrap capacitor.

In yet another aspect, an embodiment of a method of operating a switched-mode DC/DC boost converter having a bootstrapped high-side driver is disclosed. The method includes coupling a switch-node rising edge detection circuit to the bootstrapped high-side driver, the switch-node rising edge detection circuit being coupled to activate a high-side NMOS transistor of the switched-mode DC/DC converter responsive to a switch-node voltage approaching a value of an output voltage; and coupling an inductor of the switched-mode DC/DC converter between an input voltage supply and the switch-node.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled". Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The disclosed circuit is designed to operate in a DC/DC boost converter that has an output voltage 10 volts or higher. While PMOS power transistors can be utilized for the high-side switch, NMOS power transistors have several advantages over PMOS, especially for high-current applications. The N-channel majority carriers have a higher mobility than the P-channel majority carriers, giving an N-channel transistor a lower drain/source on resistance Rds(on) and gate capacitance for the same die area. An NMOS transistor also requires less area. An on-chip bootstrap capacitor is used to supply the high-side gate-driver; the high-side gate-driver does not have a constant value for a lower supply voltage, but is referred to the switch-node to account for the switch-node transitioning.

Figure 5:
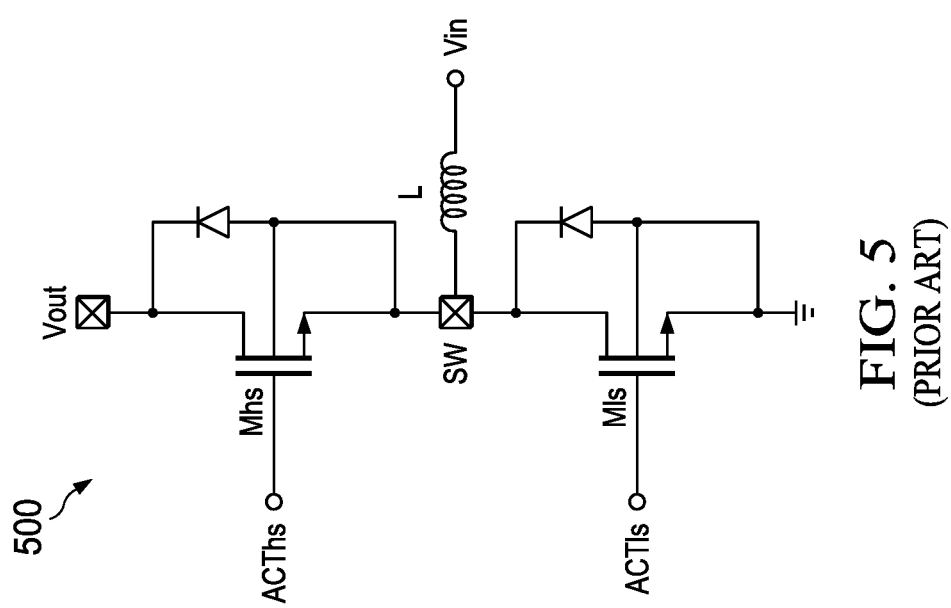
FIG. 5 depicts a boost converter power stage according to the prior art.

FIG. 5 depicts an example DC/DC boost converter power stage 500, which consists of high-side NMOS power transistor Mhs and low-side NMOS power transistor Mls, which are coupled in series between an output voltage Vout and a lower supply voltage, which in the embodiment shown is a ground plane. During operation of the circuit, output voltage Vout is coupled to a load (not specifically shown). Switch-node SW is located between high-side NMOS power transistor Mhs and low-side NMOS power transistor Mls. An inductor L is attached to switch-node SW and couples switch-node SW to an input voltage supply Vin. High-side NMOS power transistor Mhs receives an activate-high-side signal ACThs and low-side NMOS power transistor Mls receives an activate-low-side signal ACTls. When the low-side NMOS power transistor Mls is active and couples input voltage supply Vin to the ground plane, a current is built up in inductor L and inductor L stores energy in the form of a magnetic field. When low-side NMOS power transistor Mls turns off and high-side NMOS power transistor Mhs becomes active, the stored energy is released and provides a higher voltage at output voltage Vout than was provided at input voltage supply Vin.

Figure 6:
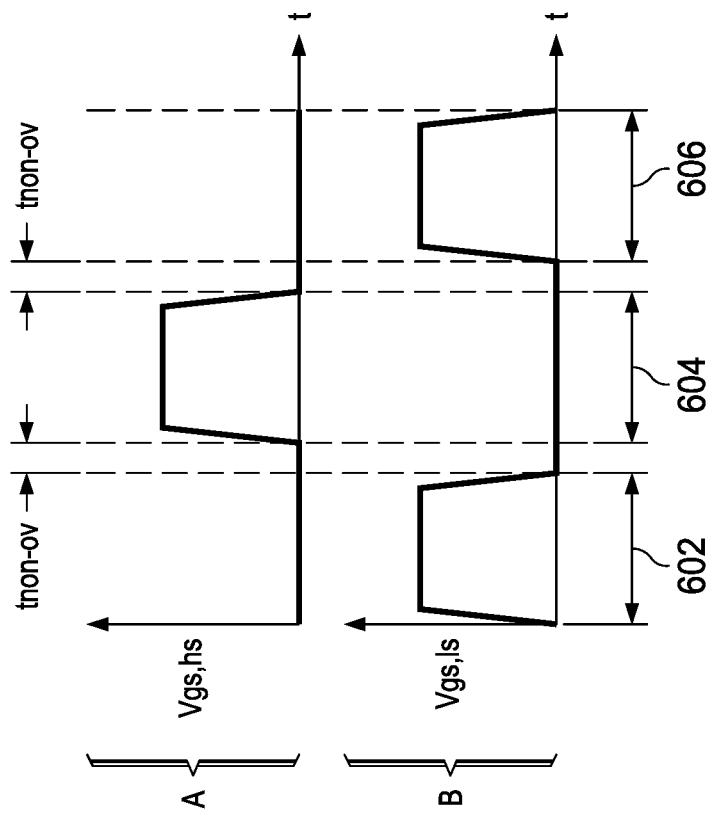
FIG. 6 demonstrates the gate to source voltages of the two NMOS transistors of FIG. 5 and the separation that is necessary for proper operation.

In the configuration of boost converter power stage 500, a non-overlap time is necessary between active phases of the low-side and high-side NMOS transistors to avoid cross-conduction. This is illustrated in FIG. 6, which depicts the high-side NMOS gate/source voltage Vgs,hs in graph A and the low-side NMOS gate/source voltage Vgs,ls in the graph B. In time periods 602 and 606, the low-side NMOS gate/source voltage Vgs,ls is high, indicating that the low-side NMOS power transistor Mls is on, while in time period 604, the high-side NMOS gate/source voltage Vgs,hs is high, indicating that the high-side NMOS power transistor Mhs is on. After the active period for low-side NMOS power transistor Mls in time period 602 when the low-side NMOS gate/source voltage Vgs,ls is completely off, there is a non-overlapping time period Tnon-ov before the high-side NMOS gate/source voltage Vgs,hs is turned on in time period 604. The same is also true when the high-side NMOS transistor is turned off at the end of time period 604, i.e., once the high-side NMOS gate/source voltage Vgs,hs is completely off, a non-overlapping time period Tnon-ov is provided before the low-side NMOS gate/source voltage Vgs,ls is turned on in time period 606.

During the operation of boost converter power stage 500, switch-node SW is connected to output voltage Vout when the high-side NMOS gate/source voltage Vgs,hs is high, as seen in graph A of FIG. 6, and is connected to the lower supply voltage, e.g., ground, when the low-side NMOS gate/source voltage Vgs,ls is high, as seen in graph B. The transition of switch-node SW from a low-state to a high-state induces high frequency noise, with two factors contributing to the noise: the steepness of the switch-node rise and switch-node ringing. As previously mentioned, this high frequency noise can be an EMI concern. The steepness of the switch-node slope is impacted by many factors. These factors can include the duration of the low-side NMOS transistor's Miller plateau, which can be affected by the use of a resistor on the gate of the low-side NMOS power transistor Mls, the inherent steepness of the voltage rise, which can be affected by the use of a snubber capacitor, the inductor current, and an early activation of the high-side power transistor.

Figure 8:
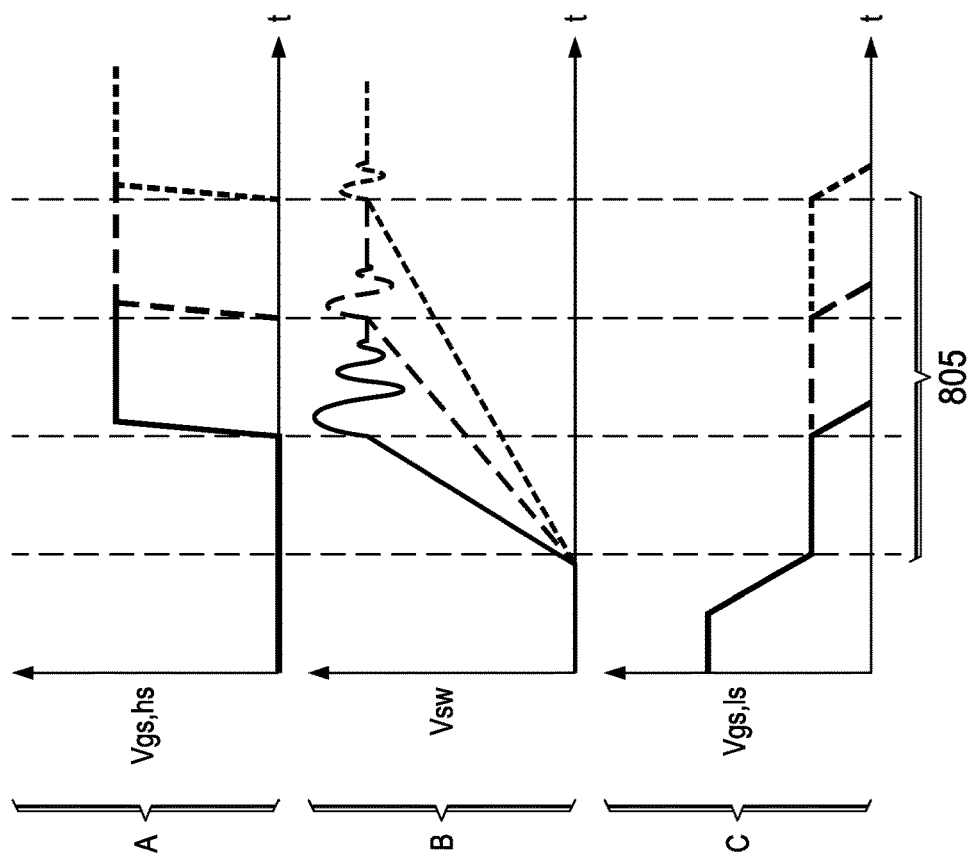
FIG. 8 depicts waveforms that illustrate the behavior of the gate control circuit of FIG. 7 as the resistor value changes.
Figure 7:
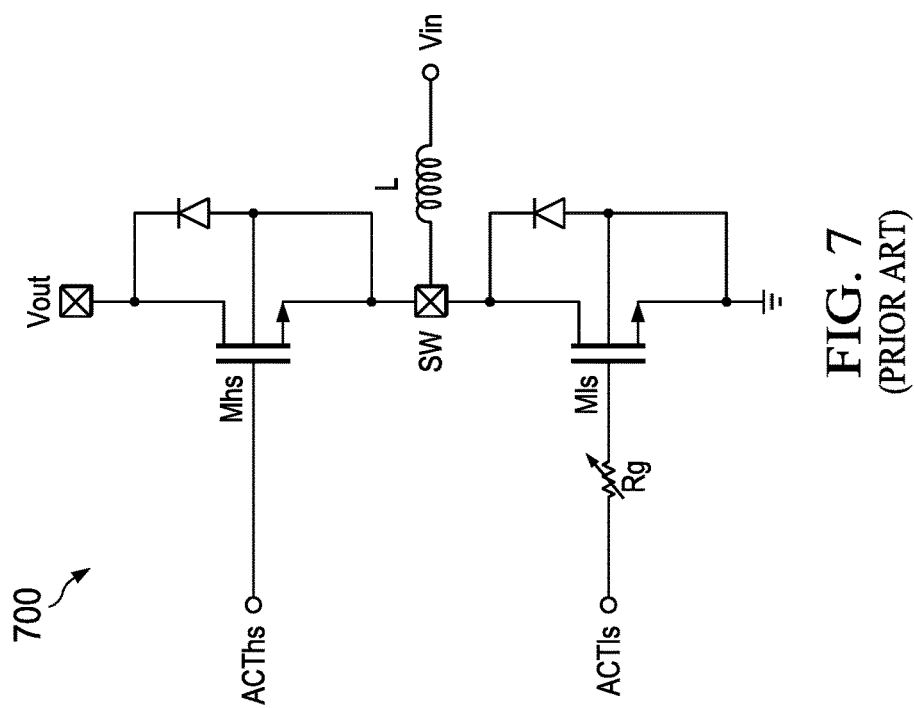
FIG. 7 depicts an boost converter power stage according to the prior art that includes a variable resistor attached to the gate of the low-side NMOS transistor.

Several techniques have been developed to reduce the steepness of the switch-node slope, although these techniques may introduce other concerns. FIG. 7 depicts a DC/DC boost converter power stage 700 in which a variable resistor Rg has been added between activate-low-side signal ACTls and low-side NMOS power transistor Mls. The effect of variable resistor Rg can be seen in FIG. 8, in which graph A depicts high-side NMOS gate/source voltage Vgs,hs at various settings as adjusted for variable resistor Rg, graph B depicts the switch-node voltage Vsw at the various settings and graph C depicts the low-side NMOS gate/source voltage Vgs,ls at the various settings. By changing the gate resistance of low-side NMOS power transistor Mls, the Miller Plateau region 805 can be extended, increasing the switch-node transition time as depicted by the three different ending points for low-side NMOS gate/source voltage Vgs,ls. Each extension of the Miller Plateau region 805 reduces the slope of switch-node voltage Vsw further and thus reduces the associated noise. When this technique is employed, the extended time of the low-side NMOS transistor being active needs to be accounted for before the high-side NMOS transistor is turned on to prevent cross-conduction, as shown by the possible turn-on times for high-side NMOS gate/source voltage Vgs,hs. While determining an appropriate turn-on time for high-side NMOS power transistor Mhs can be done when a particular value for a resistor on the low-side gate is known during design, using a variable resistor presents serious problems with determining an appropriate time to turn on the high-side NMOS transistor.

Figure 10:
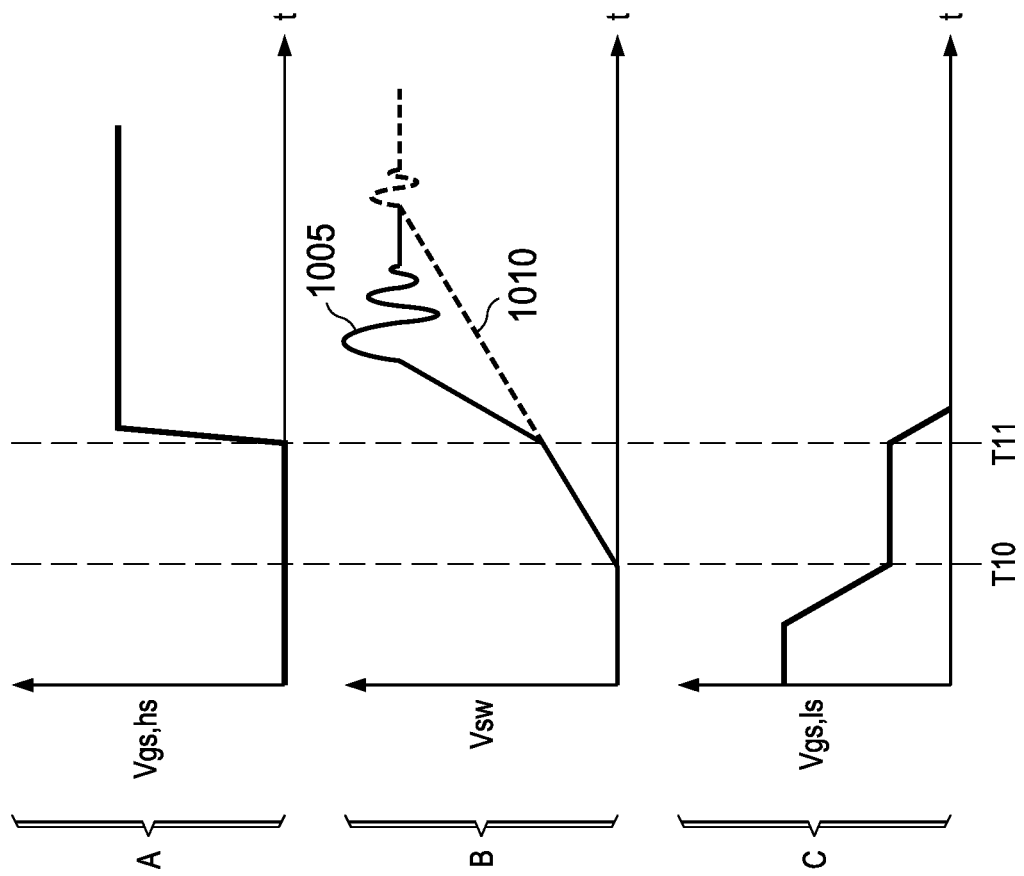
FIG. 10 depicts waveforms that illustrate possible behavior of the gate control circuit of FIG. 9 and the desired alternative.
Figure 9:
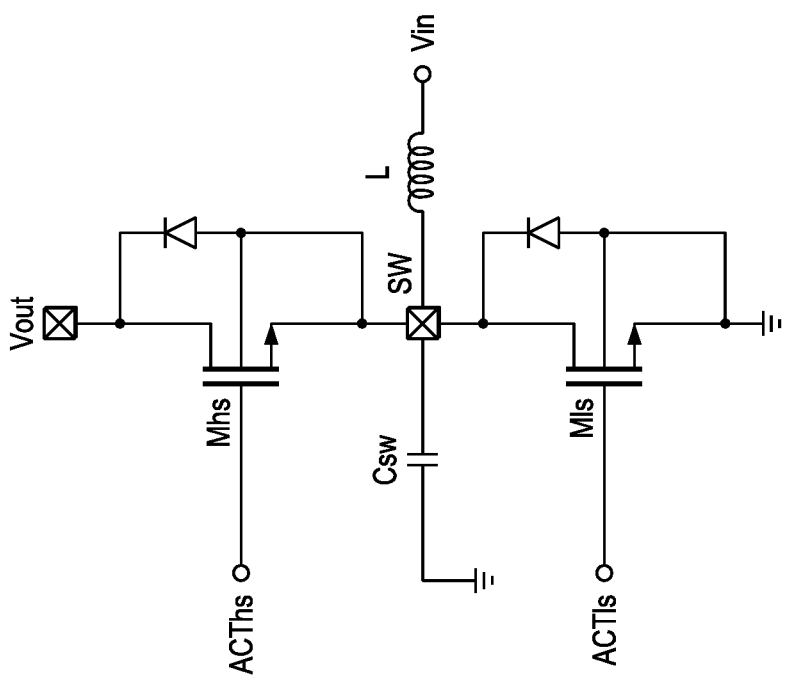
FIG. 9 depicts a boost converter power stage having a snubber capacitor at the switch-node according to the prior art.

FIG. 9 depicts another method of reducing the EMI noise by connecting a snubber capacitor Csw to switch-node SW. After the low-side NMOS power transistor Mls is turned off, inductor current from input voltage supply Vin will charge snubber capacitor Csw in a linear manner. In this case the slope for switch-node voltage Vsw is no longer defined by the low-side NMOS transistor Mls. Illustrated in FIG. 10 is a problem that can occur if the high-side NMOS transistor is activated too early, e.g., directly after the low-side NMOS transistor has been turned off. Again, graph A depicts high-side NMOS gate/source voltage Vgs,hs, graph B depicts the switch-node voltage Vsw and graph C depicts the low-side NMOS gate/source voltage Vgs,ls. As depicted in this example, at time T10, low-side NMOS power transistor Mls have been turned off and has reached the Miller plateau but is not yet completely off. Switch-node voltage Vsw 1005 starts to rise at a controlled rate. However, at time T12, high-side NMOS power transistor Mhs is turned on and high-side NMOS gate/source voltage Vgs,hs rises quickly. Because high-side NMOS power transistor Mhs is turned on prior to low-side NMOS power transistor Mls being completely off, the switch-node voltage Vsw 1005 is pulled up very quickly and provides the quick rise that the snubber capacitor Csw is intended to limit. It is therefore desirable that the high-side NMOS power transistor Mhs is only allowed to be turned on after the switch-node SW has reached its high state, which would provide the desired switch-node voltage Vsw 1010.

Figure 11:
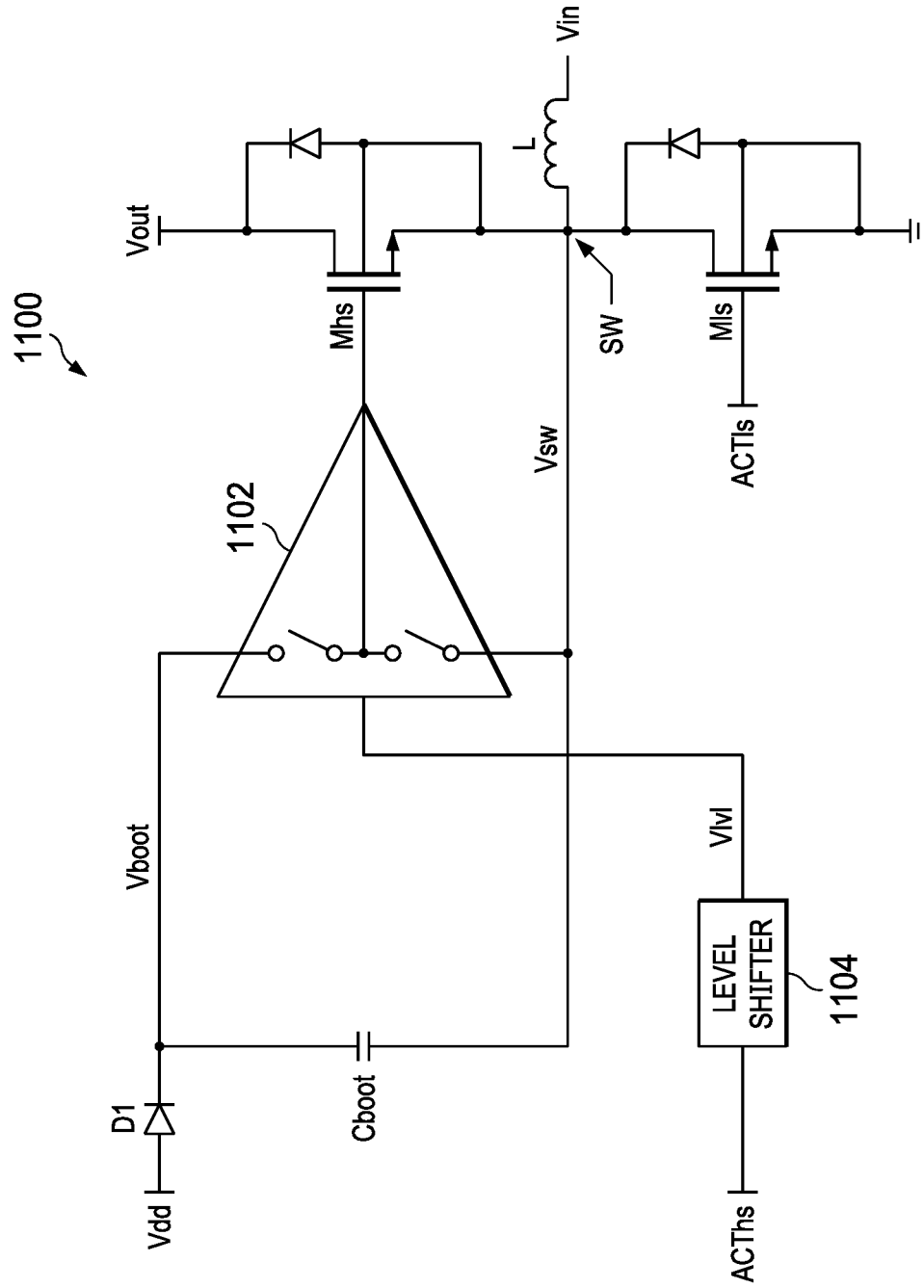
FIG. 11 depicts switched-mode DC/DC converter with a high-side gate-driver configuration according to the prior art.

Prior to looking at an embodiment of the disclosed rising edge detection circuit, a switched-mode DC/DC boost converter 1100 containing a typical high-side gate-driver 1102 for a bootstrapped high-side NMOS transistor is illustrated in FIG. 11. In this example embodiment, activate-high-side signal ACThs is received by level shifter 1104, which then provides a level-shifted activate-high signal Vlvl. Level-shifted activate-high signal Vlvl is provided to the high-side gate-driver 1102 and high-side gate-driver 1102 provides a control signal to high-side NMOS power transistor Mhs. High-side gate-driver 1102 does not receive fixed power supply voltages, but is coupled between bootstrap voltage Vboot and switch-node voltage Vsw for the upper and lower supply voltages. A bootstrap capacitor Cboot has a first terminal coupled to provide bootstrap voltage Vboot to high-side gate-driver 1102 for the benefit of high-side NMOS power transistor Mhs and a second terminal coupled to switch-node SW. Boot supply voltage Vdd is coupled to the first terminal of bootstrap capacitor Cboot and used to create an initial value for bootstrap voltage Vboot. The diode D1 is coupled between bootstrap supply voltage Vdd and bootstrap capacitor Cboot to prevent a reverse current when the switch-node SW is being pulled high.

When the low-side NMOS power transistor Mls is active, switch-node voltage Vsw and the left side (as illustrated) of inductor L are both being pulled to the ground plane, providing a current from input voltage supply Vin to the ground plane through the inductor L. Because the second terminal of bootstrap capacitor Cboot is thereby held low, the first terminal of bootstrap capacitor Cboot will be charged to the value of bootstrap supply voltage Vdd. When low-side NMOS power transistor Mls is turned off, input voltage supply Vin will continue to provide current via inductor L that charges switch-node SW until switch-node voltage Vsw approaches output voltage Vout. At the same time, as the switch-node voltage Vsw rises, the bootstrap voltage Vboot rises at the same rate. In one example embodiment, output voltage Vout is 10 V and bootstrap supply voltage Vdd is 5 V. In this example, bootstrap voltage Vboot will be set to 5 V while the low-side NMOS power transistor Mls is active, then as switch-node voltage Vsw rises to about 10 V, bootstrap voltage Vboot rises to about 15 V. The turn-on time for activate-high-side signal ACThs to go high is set by the design of the specific implementation, but needs to take into account any methods that are used to reduce the noise caused by the rise of switch-node voltage Vsw.

As mentioned previously, because switched-mode DC/DC boost converter 1100 utilizes an NMOS transistor for the high-side switch, there is a need to ensure that the active times for the high-side NMOS transistor and the low-side NMOS transistor do not overlap. In embodiments of switched-mode DC/DC boost converter 1100 where the voltages utilized is known during the design, the rise time of switch-node voltage Vsw can be determined and the turn-on time of the high-side NMOS power transistor Mhs can be set with good accuracy. However, when the output voltages and/or the inductor current can vary, setting an appropriate turn-on time of the high-side NMOS transistor is much more difficult. Additionally in this configuration, flexible switch-node slope control, as shown in FIG. 7 is not allowed, and cross conduction avoidance may not be guaranteed when a snubber capacitor as shown in FIG. 9 is employed.

Figure 1:
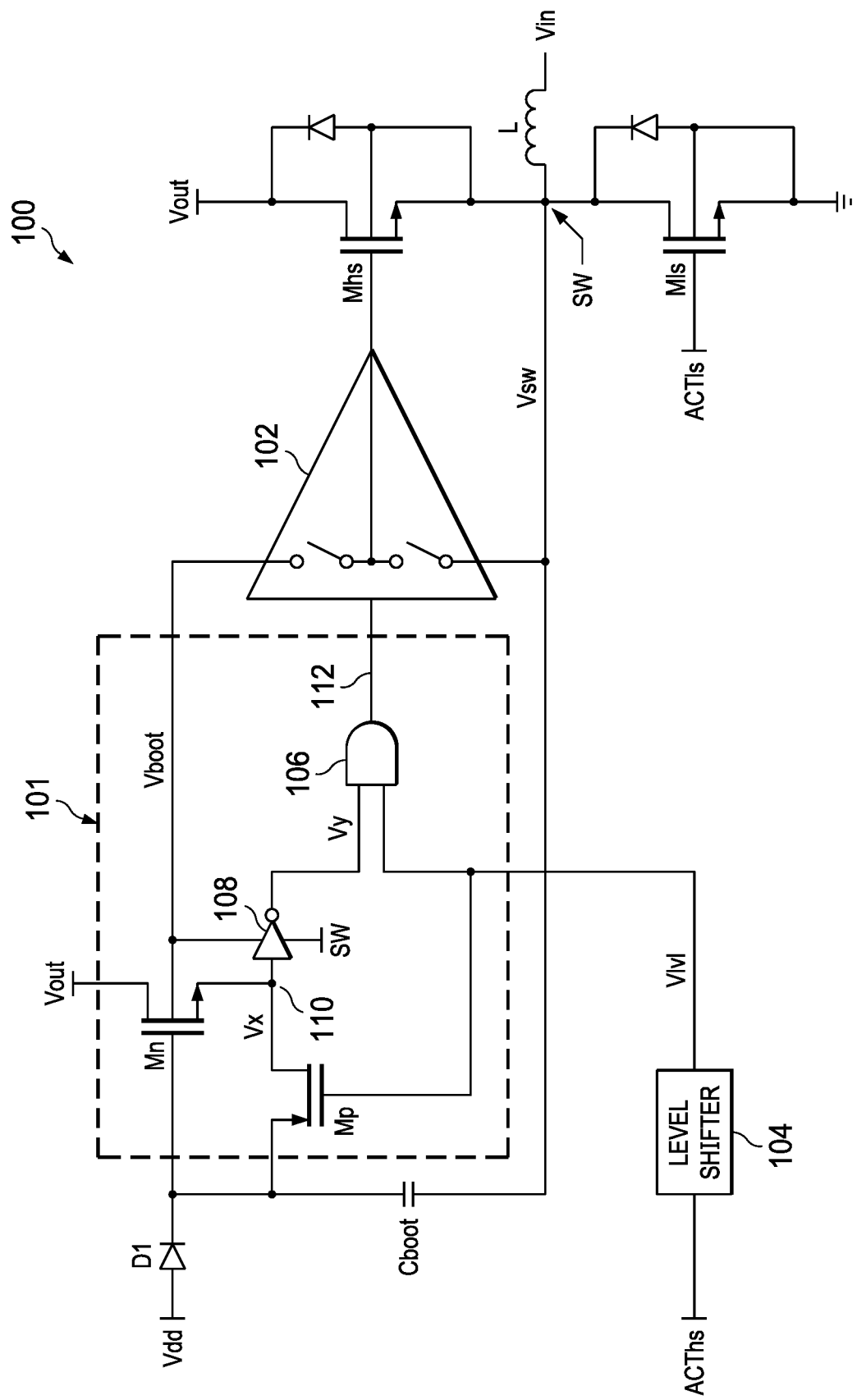
FIG. 1 depicts an example of a switched-mode DC/DC boost converter with a high-side gate-driver configuration that includes a switch-node rising edge detection circuit according to an embodiment of the disclosure.

FIG. 1 depicts a switched-mode DC/DC boost converter 100 containing a high-side gate-driver 102 for a bootstrapped high-side NMOS power transistor Mhs and a switch-node rising edge detection circuit 101 that is coupled to hold high-side NMOS power transistor Mhs off until the switch-node SW reaches a high state. Switched-mode DC/DC boost converter 100 includes activate-low-side signal ACTls, which controls the gate of low-side NMOS power transistor Mls, and level shifter 104, which receives activate-high-side signal ACThs and then sends a level-shifted activate-high signal Vlvl, which is also referred to simply as activation signal Vlvl towards high-side gate-driver 102. Activate-low-side signal ACTls and activate-high-side signal ACThs are also referred to herein as control signals. High-side gate-driver 102 is coupled to receive both bootstrap voltage Vboot and switch-node voltage Vsw as supply voltages and provides a control signal to high-side NMOS power transistor Mhs. Bootstrap capacitor Cboot has a first terminal coupled to provide bootstrap voltage Vboot to high-side gate-driver 102 and a second terminal coupled to switch-node SW. Bootstrap supply voltage Vdd is provided to charge bootstrap capacitor Cboot and to create bootstrap voltage Vboot. Diode D1 is coupled between bootstrap supply voltage Vdd and bootstrap voltage Vboot to prevent a reverse current when the switch-node is being pulled high.

Switch-node rising edge detection circuit 101 of switched-mode DC/DC boost converter 100 includes an AND gate 106, an inverter 108 and two transistors: PMOS transistor Mp and NMOS transistor Mn. The AND gate 106 receives two inputs, with a first input being the level-shifted activate-high signal Vlvl. The output of AND gate 106 is coupled to provide a switching signal 112 to high-side gate-driver 102 that causes high-side gate-driver 102 to selectively switch the voltage provided to high-side NMOS power transistor Mhs. PMOS transistor Mp is coupled in series with inverter 108 between the first terminal of bootstrap capacitor Cboot and the second input of AND gate 106. NMOS transistor Mn is coupled between the output voltage Vout and a node 110 that lies between PMOS transistor Mp and inverter 108. The voltage at node 110 is designated as voltage Vx, while the voltage between AND gate 106 and inverter 108 is designated as voltage Vy. In at least some embodiments, NMOS transistor Mn is a high-voltage rating device, e.g., when the value of output voltage Vout is high. High-side gate-driver 102 is also referred to herein as bootstrapped high-side driver 102.

Figure 2:
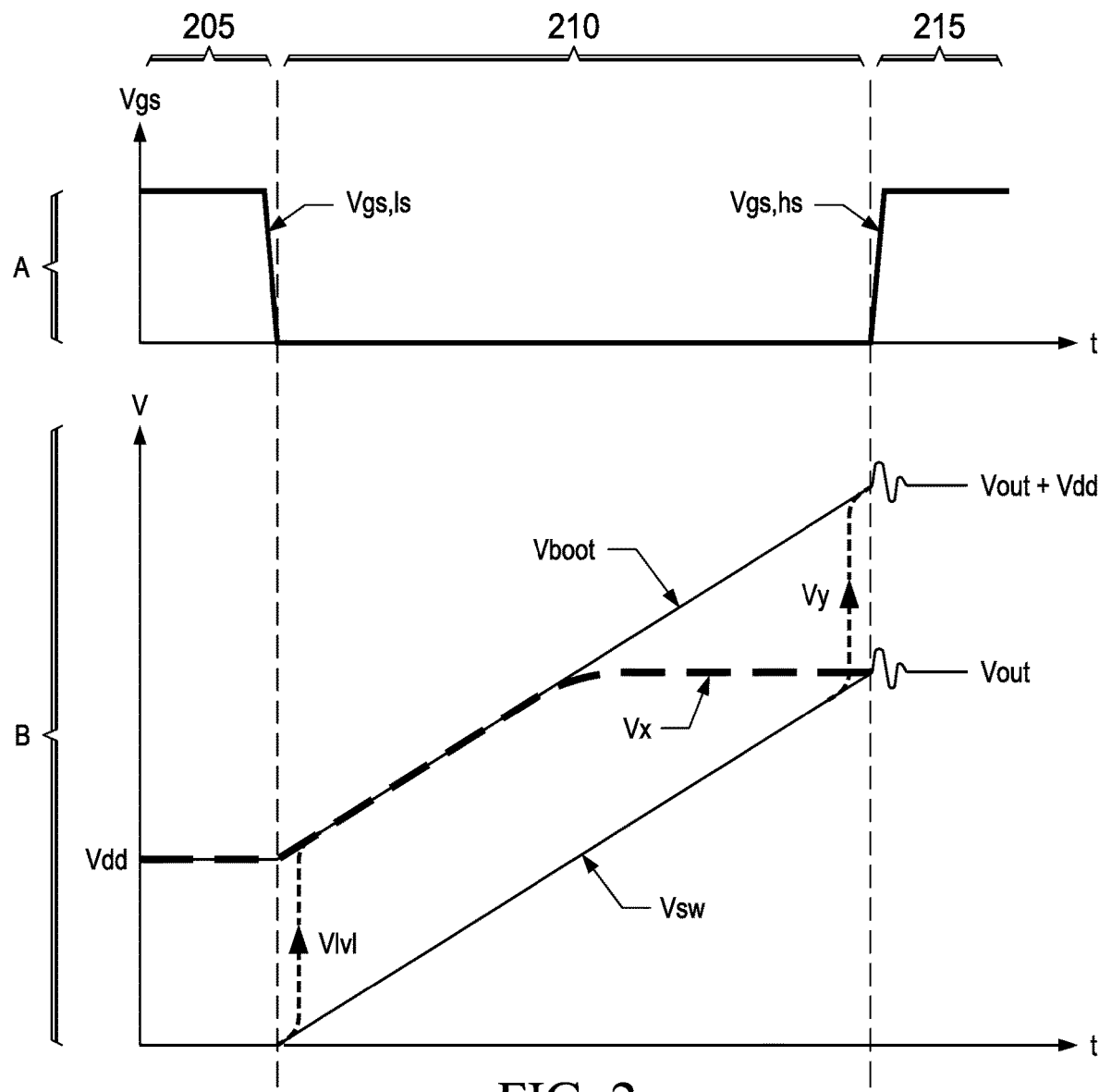
FIG. 2 depicts a number of voltage levels during operation of the circuit of FIG. 1 according to an embodiment of the disclosure.

Operation of switched-mode DC/DC boost converter 100 will now be explained with reference to FIG. 2, which illustrates the relative voltages of a number of signals from the disclosed circuit. Although not specifically labelled in FIG. 2, example voltages of 5 volts for bootstrap supply voltage Vdd and 10 volts for output voltage Vout are used in this discussion. In an initial time period 205, low-side NMOS power transistor Mls is on and low-side NMOS gate/source voltage Vgs,ls is high as shown in graph A of FIG. 2 while high-side NMOS power transistor Mhs is off and high-side NMOS gate/source voltage Vgs,hs is low. As seen in graph B of FIG. 2, during time period 205, the switch-node voltage Vsw is held low by low-side NMOS power transistor Mls and current flows from input voltage supply Vin through inductor L and low-side NMOS power transistor Mls to a ground plane. At the same time, the first terminal of bootstrap capacitor Cboot is charged to the value of bootstrap supply voltage Vdd, e.g. 5 volts; voltage Vx is also pulled up to 5 volts through the conducting channel of PMOS transistor Mp. Because inverter 108 is using bootstrap voltage Vboot (5 volts) and switch-node voltage Vsw (0 volts) as respective high and low supply voltages, voltage Vx (5 volts) is seen as high, so that voltage Vy is low. Because both inputs of AND gate 106 are low, the output of AND gate 106 is also low and high-side NMOS power transistor Mhs is off. At the same time, on NMOS transistor Mn, both the gate voltage, which is equal to bootstrap voltage Vboot and the source voltage, which is equal to voltage Vx, are 5 volts, so NMOS transistor Mn is off.

In a next time period 210, low-side NMOS power transistor Mls is turned off and low-side NMOS gate/source voltage Vgs,ls drops to zero. At the same time, activate-high-side signal ACThs (not specifically shown) is set high, which means that level-shifted activate-high signal Vlvl is also set high. Notably in this embodiment, there is no need to provide for a delay in turning on activate-high-side signal ACThs, since AND gate 106 will not switch on high-side NMOS power transistor Mhs until the second input provided by voltage Vy is also high. Because low-side NMOS power transistor Mls has been turned off, switch-node voltage Vsw starts rising due to the inductor current. As switch-node voltage Vsw rises, PMOS transistor Mp is turned off, so that voltage Vx, which is at 5 volts is no longer coupled to bootstrap voltage Vboot. At the same time, NMOS transistor Mn starts to turn on as bootstrap voltage Vboot rises, so that voltage Vx will rise until NMOS transistor Mn is fully turned on and voltage Vx reaches the value of output voltage Vout. Switch-node voltage Vsw is coupled to bootstrap voltage Vboot by bootstrap capacitor Cboot, so as switch-node voltage Vsw rises, bootstrap voltage Vboot also rises at the same rate. In our example with bootstrap supply voltage Vdd being 5 volts and output voltage Vout being 10 volts, switch-node voltage Vsw will rise to near 10 volts and bootstrap voltage Vboot will rise to near 15 volts.

As the values of both switch-node voltage Vsw and bootstrap voltage Vboot rise, the relationship of voltage Vx to the two other voltages changes. Originally voltage Vx shares the value of bootstrap supply voltage Vdd and is thus seen as having a high value, but as time period 210 progresses, the value of voltage Vx, although rising, reaches the same value as switch-node voltage Vsw and is thus seen as having a low value. Because the value seen on voltage Vx has changed, the value provided on voltage Vy also changes and voltage Vy receives a high value as time period 210 draws to a close.

In a third time period 215, with voltage Vy going high and the level-shifted activate-high signal Vlvl already set to high, AND gate 106 is receiving two high signals and will provide a high value on switching signal 112 to high-side gate-driver 102, which then activates high-side NMOS power transistor Mhs and causes high-side NMOS gate/source voltage Vgs,hs to go high, as seen in graph A. In graph B, both bootstrap voltage Vboot and switch-node voltage Vsw are at respective high points, with less noise provided because switch-node voltage Vsw was allowed to rise without an early turn-on of high-side NMOS power transistor Mhs. Thus, through the action of switch-node rising edge detection circuit 101, an early turn-on of high-side NMOS power transistor Mhs is avoided while ensuring that high-side NMOS power transistor Mhs turns on near the high value of switch-node voltage Vsw.

Figure 1A:
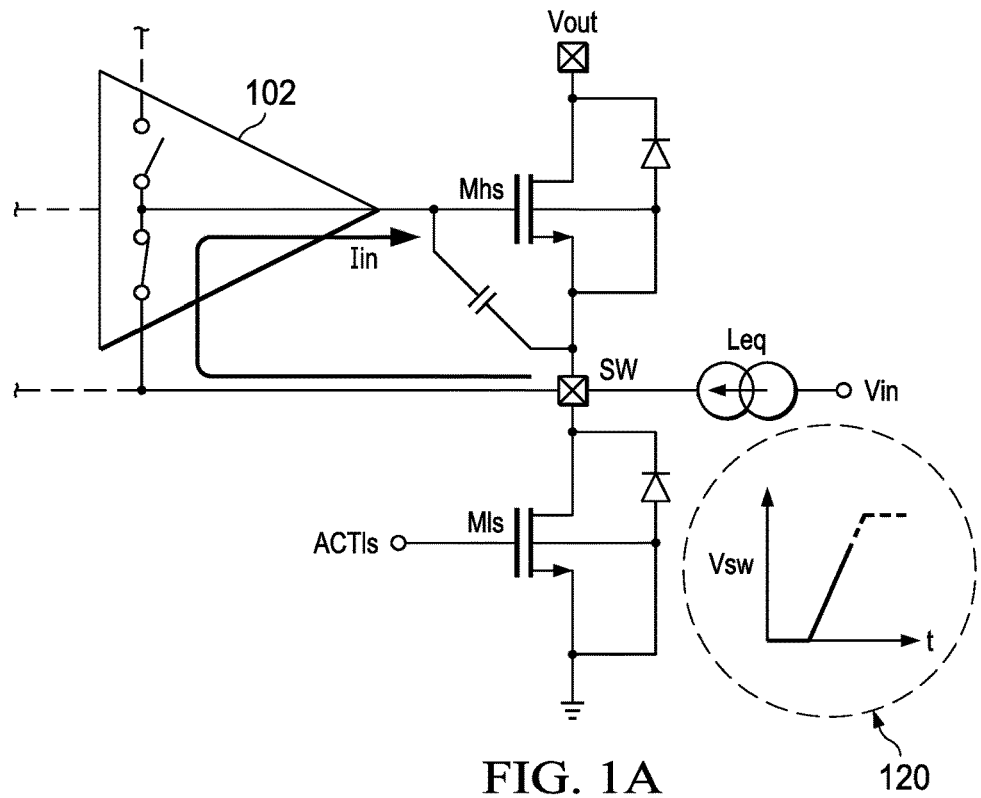
FIGS. 1A and 1B illustrate respectively the operation of the circuit of FIG. 1 as the switch-node is rising and as the switch-node reaches a peak value according to an embodiment of the disclosure.
Figure 1B:
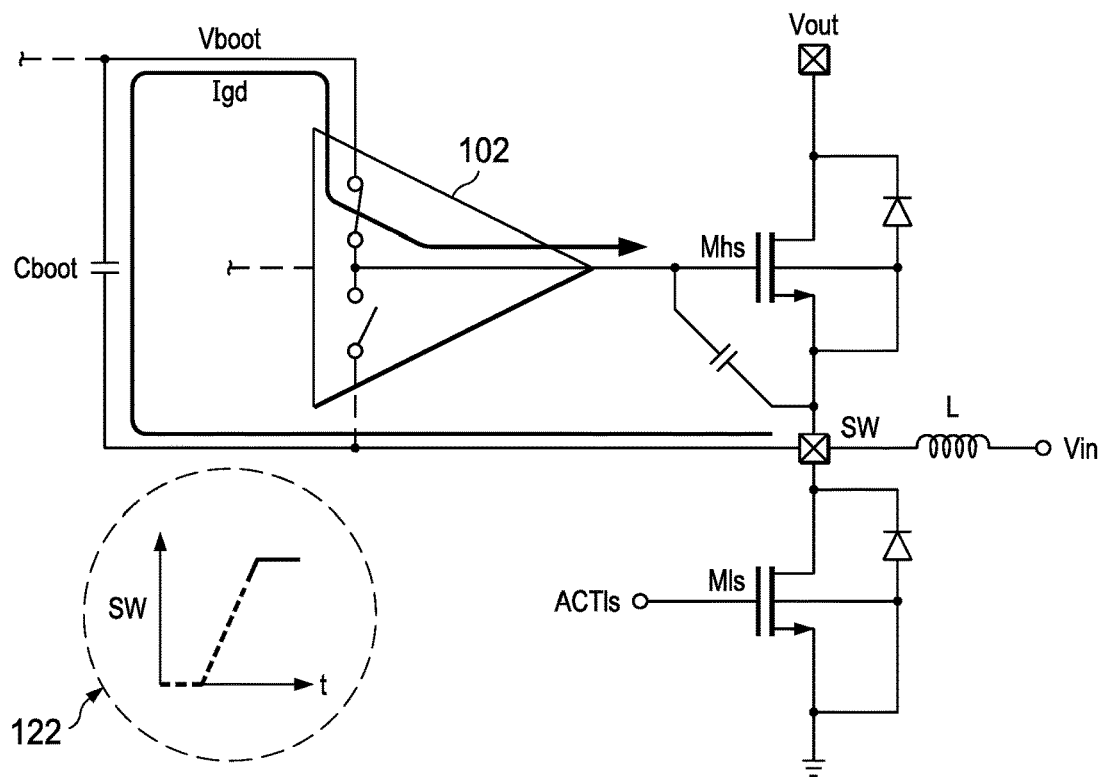

By delaying the turn-on of high-side NMOS power transistor Mhs until the switch-node voltage Vsw is near a high value, the disclosed circuit provides the ability to use the inductor current to charge the high-side gate capacitor, as will be demonstrated with regard to FIGS. 1A and 1B. It can be noted that in FIG. 1A, the inductor L is represented by an equivalent current source Leq. FIG. 1A illustrates the rising phase of the switch-node voltage Vsw, as highlighted in the graph 120 showing switch-node voltage Vsw. In this rising phase, high-side gate-driver 102 couples switch-node SW to the gate of high-side NMOS power transistor Mhs, effectively coupling the gate and source of high-side NMOS power transistor Mhs together. The coupling between switch-node SW and the gate means that as the switch-node voltage Vsw rises, not only is high-side NMOS power transistor Mhs held in the off state, but the voltage on the gate of high-side NMOS power transistor Mhs is charged by the inductor current Iin to a value near output voltage Vout.

FIG. 1B depicts the phase of switch-node voltage Vsw in which the switch-node voltage Vsw nears and reaches its peak, as highlighted in the graph 122. In this phase, high-side gate-driver 102 switches and connects the top plate of the bootstrap capacitor Cboot to the gate terminal of the high-side NMOS transistor. Bootstrap voltage Vboot, which has now reached a value that is greater than switch-node voltage Vsw by the value of bootstrap supply voltage Vdd, then completes charging of the gate capacitor of high-side NMOS power transistor Mhs using gate-drive current Igd. Since much of the current to charge the gate capacitor of the high-side NMOS power transistor Mhs came from the inductor current, bootstrap capacitor Cboot can either be made smaller than would otherwise be required or else bootstrap capacitor Cboot can bring the gate of high-side NMOS power transistor Mhs to a higher value than embodiments without the disclosed switch-node rising edge detection circuit. This fact can be especially appreciated in boost converters operating at high duty-cycles because the switch-node needs to be charged to a high voltage.

Advantages using the disclosed high-side gate-driver with switch-node rising edge detection circuit may include one or more of the following: a) simple implementation, with only two transistors and two logic gates added, b) cross-conduction of the power stage is prevented, c) flexible switch-node slopes can be utilized, d) a reduction in the chip area by enabling a smaller on-chip bootstrap capacitor, e) a reduction of high frequency noise from switch-node voltage Vsw due to an early turn-on of the high-side NMOS power transistor, and f) an increased gate voltage on high-side NMOS power transistor Mhs for the same size of bootstrap capacitor, due to a more effective high-side gate charge sequence that utilizes the inductor current to initially charge the gate of high-side NMOS power transistor Mhs.

Figure 3:
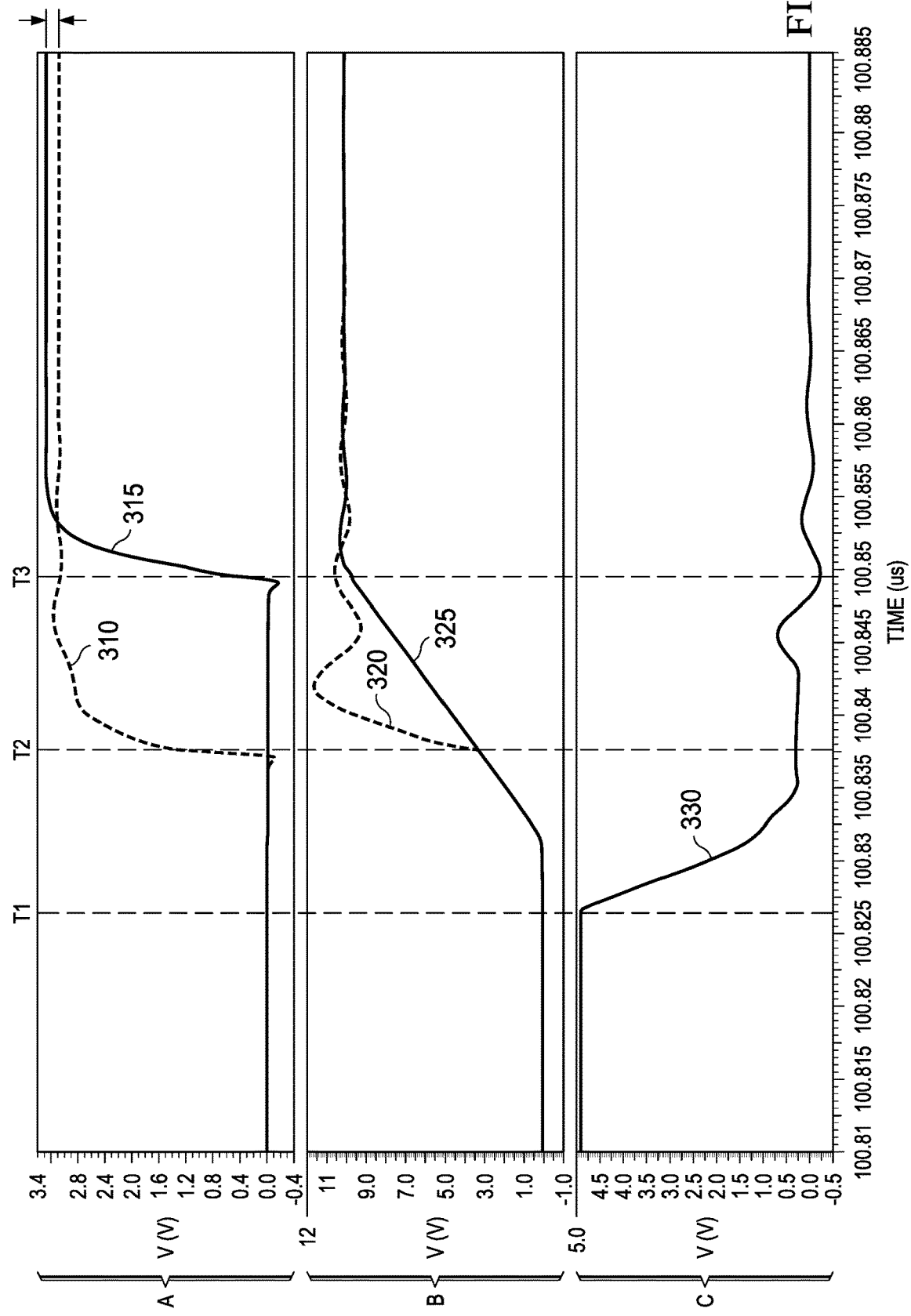
FIG. 3 depicts the gate to source voltages and switch-node voltage during a portion of the operation of the circuit of FIG. 1 according to an embodiment of the disclosure.

FIG. 3 depicts a comparison of the gate/source voltages and switch-node voltages for switched-mode DC/DC boost converter 1100 and switched-mode DC/DC boost converter 100 according to an embodiment of the disclosure and highlights the overall impact of the disclosed switch-node rising edge detection circuit 101. The signals shown in graph A depict the gate/source voltage on high-side NMOS power transistor Mhs, with the high-side NMOS gate/source voltage Vgs,hs 310 provided by older switched-mode DC/DC boost converter 1100 shown as a dotted line and the high-side NMOS gate/source voltage Vgs,hs 315 provided by disclosed switched-mode DC/DC boost converter 100 shown as a solid line. Similarly, graph B depicts the switch-node voltage Vsw, with switch-node voltage Vsw 320 provided by older switched-mode DC/DC boost converter 1100 and switch-node voltage Vsw 325 provided by disclosed switched-mode DC/DC boost converter 100. Graph C depicts the gate/source voltage on low-side NMOS power transistor Mls, with low-side NMOS gate/source voltage Vgs,ls 330 being the same in both circuits.

As the process begins, low-side NMOS power transistor Mls is turned on, with a gate voltage near 5 volts, and high-side NMOS power transistor Mhs is turned off, with a gate voltage at zero; switch-node voltage Vsw is zero. At time T1, low-side NMOS power transistor Mls begins to turn off. As low-side NMOS power transistor Mls is turning off, switch-node voltage Vsw starts to rise, with the switch-node voltage for both switched-mode DC/DC boost converter 1100 and switched-mode DC/DC boost converter 100 initially moving at the same rate. However, at time T2, switched-mode DC/DC boost converter 1100, which has a fixed dead-time, triggers early, with the high-side NMOS gate/source voltage Vgs,hs 310 starting to climb at that point. The triggering of the high-side NMOS power transistor Mhs causes switch-node voltage Vsw 320 to rise much more rapidly and to produce undesirable high frequency noise due to the high rate of climb and the resultant ringing. In contrast high-side NMOS power transistor Mhs of switched-mode DC/DC boost converter 100 does not trigger until time T3 when switch-node voltage Vsw 325 is near a maximum value. This controlled triggering of high-side NMOS power transistor Mhs of switched-mode DC/DC boost converter 100 provides for much less high frequency noise and a much smaller amount of ringing from switch-node voltage Vsw 325, as well as the prevention of cross-conduction between high-side NMOS power transistor Mhs and low-side NMOS power transistor Mls. As an added benefit, because inductor current has been employed to charge the gate capacitor of high-side NMOS power transistor Mhs, a ten percent higher gate/source voltage is achieved for high-side NMOS gate/source voltage Vgs,hs 315, as indicated by the arrows in graph A.

Figure 4:
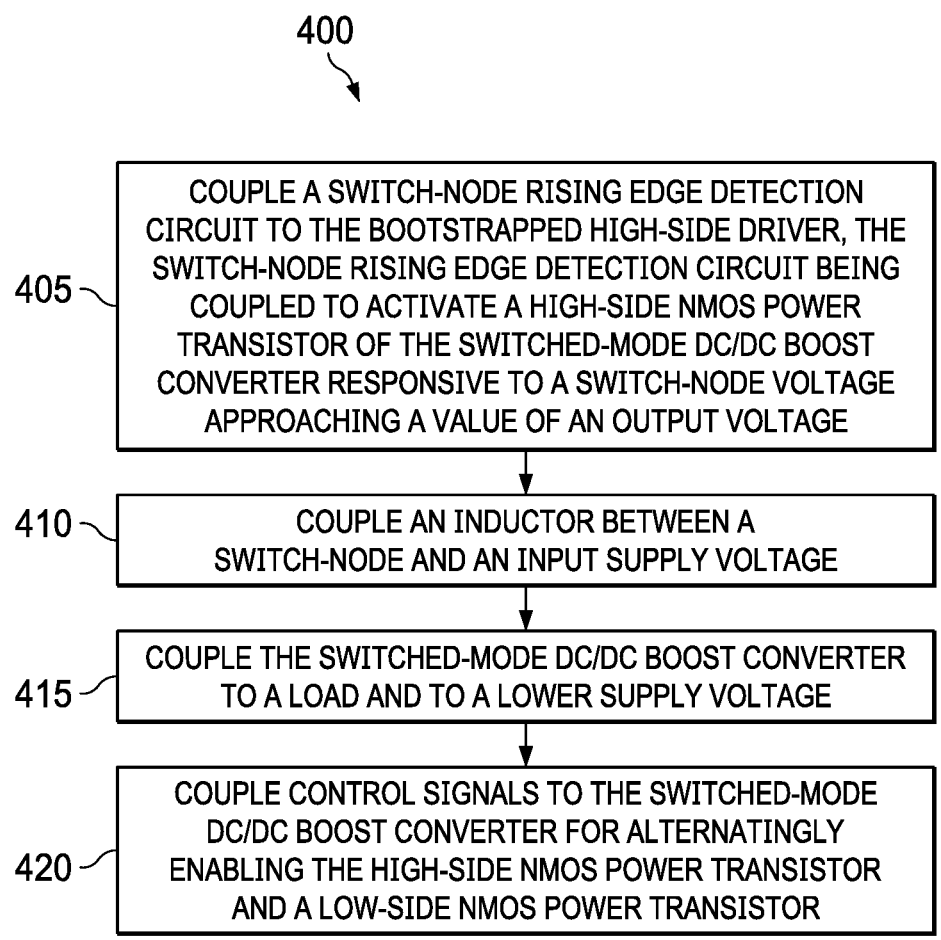
FIG. 4 depicts a method of operating a switched-mode DC/DC boost converter having a bootstrapped high-side gate-driver according to an embodiment of the disclosure.

FIG. 4 depicts a method 400 of operating a switched-mode DC/DC boost converter having a bootstrapped high-side driver. The method begins with coupling 405 a switch-node rising edge detection circuit to the bootstrapped high-side driver such that the switch-node rising edge detection circuit is coupled to activate a high-side NMOS power transistor responsive to a switch-node voltage approaching a value of an output voltage. The method couples 410 an inductor between the switch-node and an input supply voltage. The switched-mode DC/DC boost converter is also coupled 415 to a load and to a lower supply voltage. Control signals are coupled 420 to the switched-mode DC/DC boost converter for alternatingly enabling the high-side NMOS power transistor and a low-side NMOS power transistor.

A switched-node rising edge detection circuit and a bootstrapped high-side driver that uses the switched-node rising edge detection circuit have been disclosed, as well as a method of operating a switched-mode DC/DC boost converter. The switched-node rising edge detection circuit can provide the ability to utilize switch-node slope control, which can be problematic in switched-mode DC/DC boost converters without the disclosed circuit, while preventing cross-conduction of the power stage. This advantage provides a degree of flexibility in switch-node rise time, which can be allowed to vary across a much larger range than was previously possible. A reduction in chip area can be realized through the use of inductor current for charging the gate capacitor of the high-side NMOS power transistor Mhs during switch-node transitioning, thus allowing a smaller bootstrap capacitor. The switched-node rising edge detection circuit only uses two small transistors and two logic gates to implement the disclosed switch-node control.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A switch-node rising edge detection circuit for a switched-mode DC/DC boost converter, the converter having a high-side gate-driver coupled to selectively couple one of a first terminal of a bootstrap capacitor and a switch-node to a gate of a high-side N-type metal oxide silicon (NMOS) power transistor, which is coupled to a voltage output, the switch-node rising edge detection circuit comprising:
  an AND gate having an activation input, a second input, and having a switching output coupled to the high-side gate-driver;

a P-type metal oxide silicon (PMOS) transistor coupled in series with an inverter between the first terminal of the bootstrap capacitor and a second input of the AND gate, the inverter having supply inputs coupled to the first terminal of the bootstrap capacitor and to the switch-node and the PMOS transistor having a gate coupled to the activation input; and an NMOS transistor coupled between the voltage output of the switched-mode DC/DC boost converter and a node that lies between the PMOS transistor and the inverter, the NMOS transistor having a gate coupled to the first terminal of the bootstrap capacitor.

2. The switch-node rising edge detection circuit of claim 1 in which the NMOS transistor is a high-voltage rating transistor.

3. A switched-mode DC/DC boost converter comprising:
a high-side N-type metal oxide silicon (NMOS) power transistor coupled in series with a low-side NMOS power transistor between a voltage output and a lower voltage supply, the NMOS power transistor having a gate;
a switch-node located between the high-side NMOS power transistor and the low-side NMOS power transistor;
a bootstrap capacitor having a first terminal coupled to a bootstrap voltage supply and a second terminal coupled to the switch-node;
a high-side gate-driver having an input, and having an output coupled to selectively couple the bootstrap voltage supply to the gate of the high-side NMOS power transistor;
an AND gatehaving an activation input and a second input, and having an output coupled the high-side gate-driver;
a P-type metal oxide silicon (PMOS) transistor having a source coupled to the first terminal of the bootstrap capacitor, having a drain, and having a gate coupled to the activation input;
an inverter having an input coupled between the drain of the PMOS transistor and the second input of the AND gate, the inverter the inverter having supply inpuots coupled to the first terminal of the bootstrap capacitor and to the switch-node; and
an NMOS transistor coupled between the voltage output and the drain of the PMOS transistor, the NMOS transistor having a gate coupled to the first terminal of the bootstrap capacitor.

4. The circuit of claim 3 including a diode coupled between the bootstrap voltage supply and the bootstrap capacitor.

5. The circuit of claim 4 in which the high-side gate-driver is coupled to selectively couple the switch-node to the gate of the high-side NMOS power transistor.

6. The circuit of claim 5 including a level-shifter having an activate-high-side input and having an output coupled to the activation input.

7. A method of operating a switched-mode DC/DC boost converter having a bootstrapped high-side driver, the method comprising:
turning on a low side drive transistor to couple current from a voltage in source, through an inductor, a switch node, and the low side driver transistor to a ground plane;
charging a first terminal of a boot capacitor to a boot voltage and coupling a second terminal of the boot capacitor to a switch node voltage at the switch node, the boot voltage being relative to the switch node voltage;
coupling a base a source of a high side drive transistor to the switch node, and switch node voltage, through a high side drive circuit, the coupling including maintaining the high side drive transistor turned off;
turning off the low side driver transistor;
increasing the switch node voltage with current from the inductor, including increasing the boot voltage and coupling charge to the base of the high side drive transistor while maintaining the high side drive transistor turned off;
turning on the high side drive transistor by switching the increasing boot voltage to the base of the high side drive transistor through the high side drive circuit in response to switching output states of gating circuitry.

8. The method of claim 7 including coupling the switched-mode DC/DC boost converter to a load and to a lower supply voltage.

9. The method of claim 8 including coupling control signals to the switched-mode DC/DC boost converter for alternatingly enabling the high-side NMOS power transistor and a low-side NMOS power transistor.

10. The method of claim 7 in which the switching output states of gating circuitry includes switching an output state of an inverter.

11. The method of claim 7 in which the switching output states of gating circuitry includes switching an output state of an AND gate.

12. The method of claim 7 in which the switching output states of gating circuitry includes switching an output state of an inverter and an AND gate.

13. The method of claim 7 in which switching output states of gating circuitry includes receiving a high state at an input of an AND gate, producing a high state at an output of the AND gate, and switching the high side driver circuit in response to the high state at the output of the AND gate.

14. The method of claim 7 in which switching output states of gating circuitry includes receiving a low state at an input of an inverter, producing a high state at the output of the inverter, receiving the high state at an input of an AND gate, producing a high state at an output of the AND gate, and switching the high side driver circuit in response to the high state at the output of the AND gate.

\* \* \* \* \*